United States Patent
Park

(10) Patent No.: US 8,294,760 B2
(45) Date of Patent: Oct. 23, 2012

(54) ELECTRONIC PART RECOGNITION APPARATUS AND CHIP MOUNTER HAVING THE SAME

(75) Inventor: Jae-Hyun Park, Seongnam-si (KR)

(73) Assignee: Samsung Techwin Co., Ltd., Changwon-si (KR)

(*) Notice: Subject to any disclaimer, the term of this patent is extended or adjusted under 35 U.S.C. 154(b) by 719 days.

(21) Appl. No.: 12/427,074

(22) Filed: Apr. 21, 2009

(65) Prior Publication Data
US 2010/0266193 A1    Oct. 21, 2010

(51) Int. Cl.
*H04N 7/18* (2006.01)
(52) U.S. Cl. .............. 348/87; 348/91; 356/609
(58) Field of Classification Search .......... 348/86, 348/87, 92; 356/601, 609
See application file for complete search history.

(56) References Cited

U.S. PATENT DOCUMENTS

| | | | |
|---|---|---|---|
| 5,076,697 A * | 12/1991 | Takagi et al. | 356/603 |
| 6,055,055 A * | 4/2000 | Toh | 356/609 |
| 6,341,878 B1 * | 1/2002 | Chiang | 362/293 |
| 6,839,958 B2 * | 1/2005 | Mannhart et al. | 29/740 |

FOREIGN PATENT DOCUMENTS

| | | |
|---|---|---|
| JP | 2005-340239 A | 12/2005 |
| KR | 10-0183928 B1 | 12/1998 |
| KR | 10-2006-0019677 A | 3/2006 |
| KR | 1020070092494 A | 9/2007 |

OTHER PUBLICATIONS

Office Action established for KR 10-2007-0095813 (Nov. 21, 2011).
Decision to Grant established for KR 10-2007-0095813 (Apr. 27, 2012).

* cited by examiner

*Primary Examiner* — Viet Vu
(74) *Attorney, Agent, or Firm* — Drinker Biddle & Reath LLP

(57) ABSTRACT

An electronic part recognition apparatus and a chip mounter having the same are provided. The apparatus includes a part conveyor unit for moving an electronic part along a path and mounting the part at a mounting position, a position recognition portion for continuously recognizing position information of the part conveyor unit moving along the path, a controller for receiving the position information from the position recognition portion and generating a photographing signal, and an image processing unit for receiving the photographing signal from the controller and time-exposing the part to light to photograph an image of the part when the part is located at a part recognition region while the conveyor unit moves. The apparatus can capture an image of a part suctioned by a nozzle installed in a head of a chip mounter and moved without stoppage of the head to recognize a state of the suctioned electronic part.

18 Claims, 8 Drawing Sheets

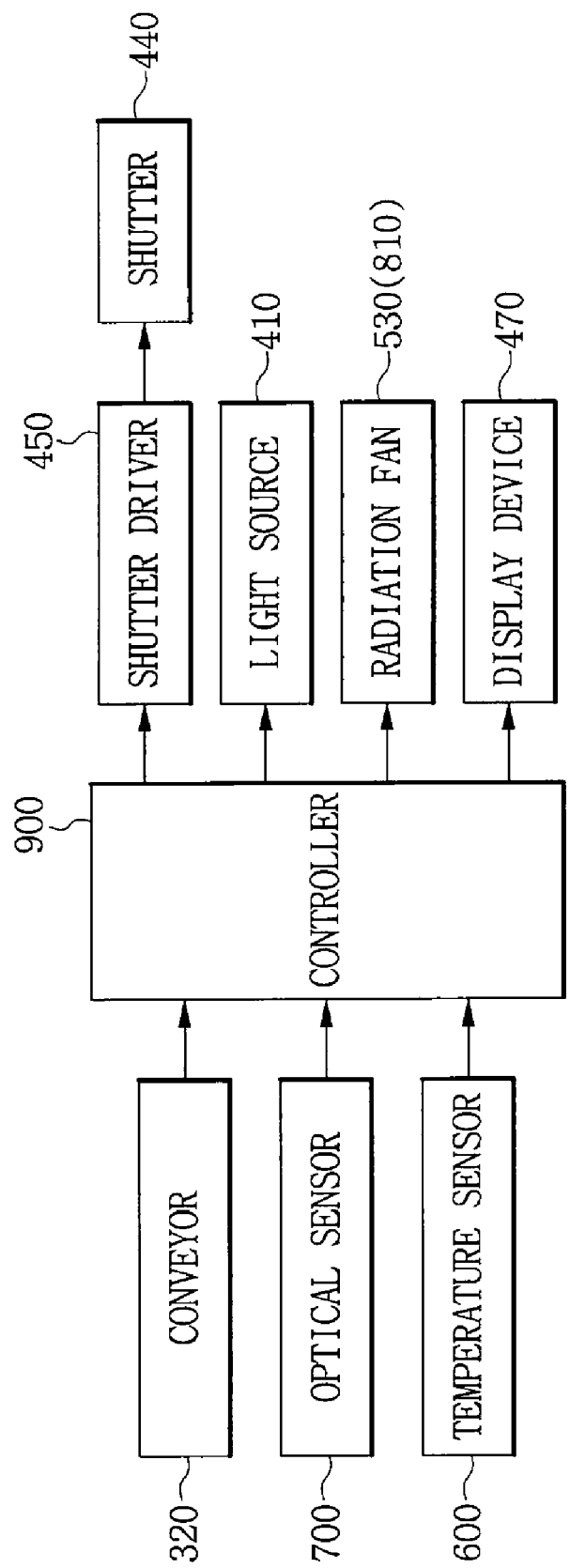

ELECTRONIC PART RECOGNITION APPARATUS AND CHIP MOUNTER HAVING THE SAME

BACKGROUND

The present invention relates to a chip mounter. Various embodiments of the invention relate to an electronic part recognition apparatus and a chip mounter having the same that are capable of photographing images of an electronic part while the electronic part is suctioned by a nozzle installed in a head, without stoppage of the head as it moves to a mounting position.

In general, a chip mounter is an apparatus for mounting electronic parts such as semiconductor packages on a printed circuit board (PCB).

In recent times, substrates have become dense and highly functional, and therefore, individual integrated circuit parts have also become highly functional. As a result, the number of output pins mounted on the substrate is increased and intervals between the output pins are reduced.

Therefore, before mounting electronic parts on a substrate, the parts must be rotated to accurate angles to be precisely mounted.

In order to precisely mount a part supplied from a part supply portion at a predetermined position on the substrate, a suction state and a center position of the part must be accurately recognized. For this purpose, an electronic part recognition apparatus is used.

The part recognition apparatus includes a camera for recognizing parts and an illumination system. The camera may include a line scan camera and an area scan camera, and the illumination system may be a bright field illumination system.

Among these, the area scan camera uses the bright field illumination system, and since the electronic part is photographed in a stopped state, exposure time may be lengthened.

In addition, the illumination system mounted on the area scan camera requires light intensity that can be provided for a long exposure time, rather than excessive brightness. Therefore, the illumination system applied to the area scan camera is vulnerable to overheating.

Here, since the chip mounter can increase productivity when the parts are mounted at the shortest distance, while the nozzle suctions the electronic part and moves it from a pick-up position to a mounting position, the mounting state of the electronic part must be recognized to perform optimal mounting.

However, since a timing operation of the conventional camera is very long, an image capture operation is very difficult to perform.

SUMMARY

An exemplary embodiment of the invention provides an electronic part recognition apparatus and a chip mounter having the same that are capable of photographing images of an electronic part while the electronic part is suctioned by a nozzle installed in a head, without stoppage of the head as it moves to a mounting position.

Another exemplary embodiment of the invention provides an electronic part recognition apparatus and a chip mounter having the same that are capable of recognizing an electronic part using multi-array light sources at various angles while the part is suctioned by a nozzle and moved.

Still another exemplary embodiment of the invention provides an electronic part recognition apparatus and a chip mounter having the same that are capable of turning on multi-array light sources optimized to recognize an electronic part, and recognizing mirror-surface parts by differentiating positions and light intensities of the light sources arrayed depending on characteristics of the part in an illumination system using the multi-array light sources.

Yet another exemplary embodiment of the invention provides an electronic part recognition apparatus and a chip mounter having the same that are capable of shortening a light exposure time of an electronic part to 50~60 µs while the part is suctioned by a nozzle and moved, and performing instant channel-specific lighting in order to provide sufficient light intensity for the short exposure time.

One aspect of the invention is directed to an electronic part recognition apparatus including: a part conveyor unit for moving an electronic part along a part moving path and mounting the part at a mounting position; a position recognition portion for continuously recognizing position information of the part conveyor unit moving along the part moving path; a controller for receiving the position information from the position recognition portion and generating a photographing signal; and an image processing unit for receiving the photographing signal from the controller and exposing the electronic part to light for a certain time to photograph an image of the electronic part when the electronic part is located at a part recognition region while the part conveyor unit moves.

Here, the image processing unit may include a light source disposed adjacent to the part recognition portion and emitting light at a certain illuminance or more; and an image photographer electrically connected to the controller, photographing an image of the electronic part exposed to the light for the certain time, and transmitting the photographed image to the controller.

In addition, the controller may generate the photographing signal to turn on the light source for a certain time, and the part recognition region may be set in the controller.

Further, the part conveyor unit may include a nozzle module disposed on the part moving path and gripping the electronic part by suction provided from the exterior; and a conveyor connected to the nozzle module, continuously moving the nozzle module along the part moving path, and transmitting the position information within the part recognition region to the controller.

Here, the position recognition portion may be an encoder installed at the conveyor and transmitting moving position information of the conveyor to the controller as an electrical signal.

In addition, the controller may set a light exposure time determined by opening and closing a shutter as 50~60 µs.

Further, the controller may be electrically connected to optical sensors for measuring intensity of light emitted from the light source and transmitting the measured light intensity to the controller, and the controller may control operation of the light source such that the measured light intensity falls within a predetermined reference light intensity range.

Furthermore, the light source may include a side illumination portion installed to help illumination provided at a lead and a ball of the electronic part, and first and second illumination portions installed to help illumination provided at a center portion of the electronic part.

In addition, the light source may be installed at an illumination unit to provide flash illumination, and the illumination unit may further include a radiation portion for radiating heat generated by the light source.

Further, the radiation portion may include a radiation cover disposed in front of the light source, a radiation plate disposed behind the light source, and a radiation fan installed adjacent to the radiation plate and electrically connected to the controller.

Furthermore, the radiation portion may further include a temperature sensor disposed adjacent to the light source, measuring a temperature adjacent to the light source, and transmitting the measured temperature to the controller, and the controller may control operation of the radiation portion such that the temperature falls within the reference temperature range.

In another aspect, the invention is directed to a chip mounter having an electronic part recognition apparatus. The chip mounter includes: a main body having a mounting position of the electronic part and a part moving path along which the electronic part moves to the mounting position; a part supply unit installed at the main body and supplying the moving electronic part; a part conveyor unit installed at the main body and receiving the electronic part from the part supply unit to move the electronic part along the part moving path to the mounting position and mount the electronic part; a position recognition portion for continuously recognizing position information of the part conveyor unit moving along the part moving path; a controller for receiving the position information from the position recognition portion and generating a photographing signal; and an image processing unit for receiving the photographing signal from the controller and exposing the electronic part to light for a certain time to photograph an image of the electronic part when the electronic part is located at a part recognition region while the part conveyor unit moves.

Here, the image processing unit may include a light source disposed adjacent to the part recognition portion and emitting light at a certain illuminance or more; and an image photographer electrically connected to the controller, photographing an image of the electronic part exposed to the light for the certain time, and transmitting the photographed image to the controller.

In addition, the controller may generate the photographing signal to turn on the light source for a certain time, and the part recognition region may be set in the controller.

Further, the part conveyor unit may include a nozzle module disposed on the part moving path and gripping the electronic part by suction provided from the exterior; and a conveyor connected to the nozzle module, continuously moving the nozzle module along the part moving path, and transmitting the position information within the part recognition region to the controller.

Here, the position recognition portion may be an encoder installed at the conveyor and transmitting moving position information of the conveyor to the controller as an electrical signal.

In addition, the controller may set a light exposure time determined by opening and closing a shutter as 50~60 μs.

Further, the controller may be electrically connected to optical sensors for measuring intensity of light emitted from the light source and transmitting the measured light intensity to the controller, and the controller may control operation of the light source such that the measured light intensity falls within a predetermined reference light intensity range.

Furthermore, the light source may include a side illumination portion installed to help illumination provided at a lead and a ball of the electronic part, and first and second illumination portions installed to help illumination provided at a center portion of the electronic part.

In addition, the light source may be installed at an illumination unit to provide flash illumination, and the illumination unit may further include a radiation portion for radiating heat generated by the light source.

Further, the radiation portion may include a radiation cover disposed in front of the light source, a radiation plate disposed behind the light source, and a radiation fan installed adjacent to the radiation plate and electrically connected to the controller.

Furthermore, the radiation portion may further include a temperature sensor disposed adjacent to the light source, measuring a temperature adjacent to the light source, and transmitting the measured temperature to the controller, and the controller may control operation of the radiation portion such that the temperature falls within the reference temperature range.

BRIEF DESCRIPTION OF THE DRAWINGS

The foregoing and other objects, features and advantages of various embodiments of the invention will be apparent from the more particular description of an exemplary embodiment of the invention illustrated in the accompanying drawing. The drawing is not necessarily to scale, emphasis instead being placed upon illustrating the principles of the invention.

FIG. 8 is a view showing operation of the image processing unit of FIG. 7.

DETAILED DESCRIPTION OF THE EMBODIMENTS

The present invention will now be described more fully hereinafter with reference to the accompanying drawings, in which exemplary embodiments of the invention are shown.

Figure 1:
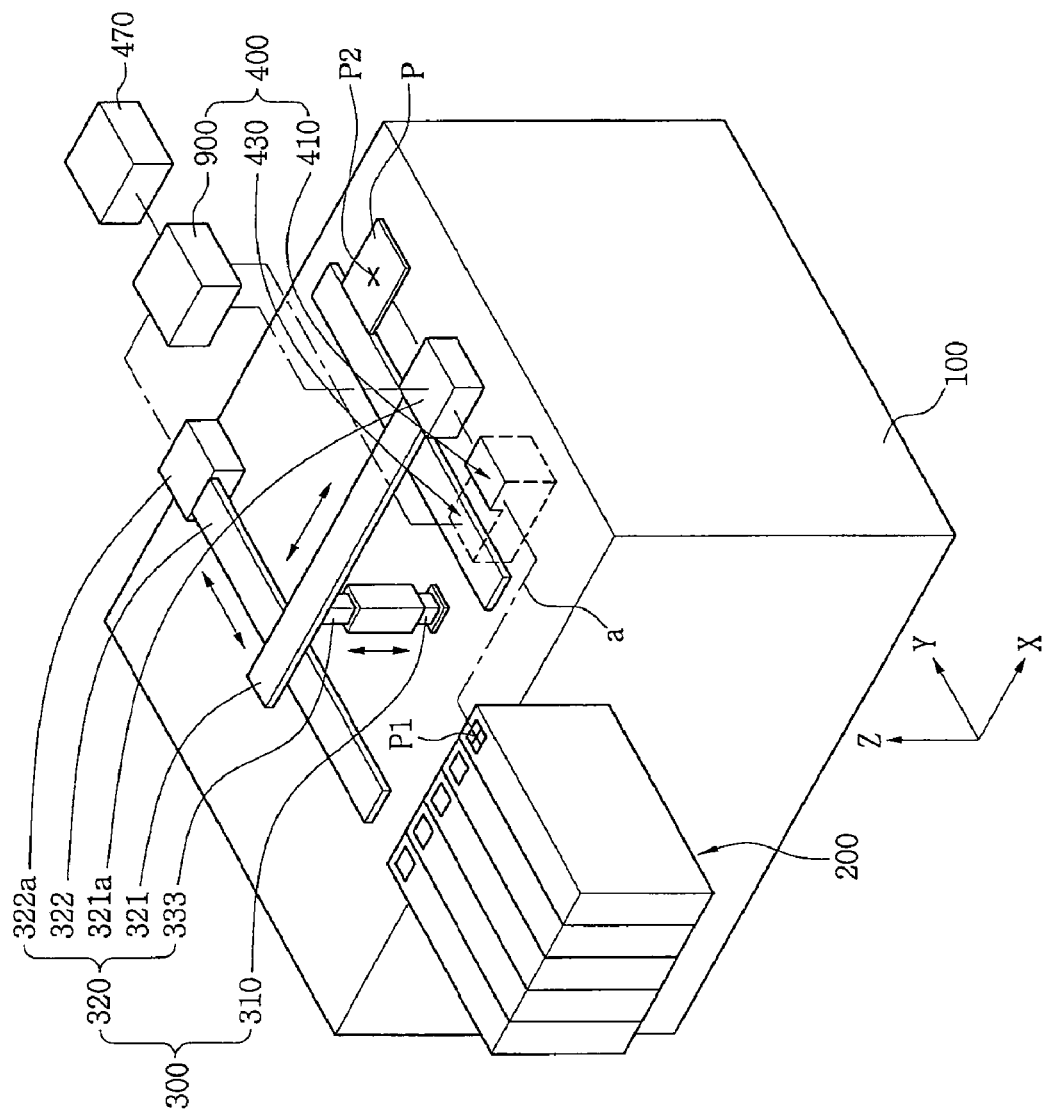
FIG. 1 is a perspective view of a chip mounter having an electronic part recognition apparatus in accordance with an exemplary embodiment of the present invention.

Referring to FIG. 1, the chip mounter in accordance with an exemplary embodiment of the present invention includes a main body 100. The main body 100 has a mounting position P2 of an electronic part 50 mounted on a printed circuit board P. Here, the printed circuit board P may be moved to the mounting position P2 of the main body 100 by a conveyor apparatus (now shown).

In addition, a part supply unit 200 is installed at the main body 100 to supply the electronic part 50. The part supply unit 200 may be a tape feeder, and can sequentially supply a certain number of electronic parts 50 to a pick-up position P1.

Further, a part conveyor unit 300 is installed at the main body 100. A part moving path a formed at the main body 100 is a path for connecting the pick-up position P1 and the mounting position P2. Therefore, the part conveyor unit 300 can grip the electronic part 50 loaded to the pick-up position P1 by suction provided from the exterior and convey it to the mounting position P2 along the part moving path a.

That is, the part conveyor unit 300 can receive the electronic part 50 from the part supply unit 200, and move the electronic part 50 along the part moving path a to the mounting position P2 and mount the electronic part 50.

The part conveyor unit 300 includes a conveyor 320 such as a gentry disposed at the main body 100, and a nozzle module 310 such as a head connected to the conveyor 320 and moving along X-, Y- and Z-axis by operation of the conveyor 320 to grip the electronic part 50. Here, the conveyor 320 may include X-, Y- and Z-axis moving portions 321, 322 and 323 for moving the nozzle module 310.

In addition, the conveyor 320 has a position recognition portion (not shown) for continuously recognizing position information of the nozzle module 310 moved along the part moving path a.

Further, the X- and Y-axis moving portions 321 and 322 may include X- and Y-axis motors 321a and 322a such as linear motors for moving the nozzle module 310, respectively, and the Z-axis moving portion 323 may be an apparatus for vertically adjusting the position of the nozzle module 310 along a Z-axis, for example, an actuator. Furthermore, the X- and Y-axis motors 321a and 322a may include encoders (not shown) for generating electric signals depending on movement of the nozzle module 310, respectively.

In addition, the nozzle module 310 may receive suction from the exterior to suction one surface of the electronic part 50. Here, whether the electronic part 50 is suctioned by the nozzle module 310 or not may be determined by formation or release of the suction in the nozzle module 310.

Further, the chip mounter in accordance with an exemplary embodiment of the present invention includes a controller 900 for receiving a signal of the position information from the position recognition portion and generating a photographing signal, and an image processing unit 400 for receiving the photographing signal from the controller 900, and exposing the electronic part to light for a certain time to photograph an image of the electronic part 50 when the electronic part 50 is disposed at a part recognition region A during movement of the part conveyor unit 300.

Specifically, the image processing unit is installed at the main body 100 under the part conveyor unit 300, and electrically connected to the part conveyor unit 300.

Here, the image processing unit 400 can receive the photographing signal from the controller 900 when the electronic part 50 is located at the part recognition region A during movement of the electronic part 50 along the part moving path a, and expose the electronic part 50 to light for a certain time to photograph an image of the electronic part 50.

Figure 2:
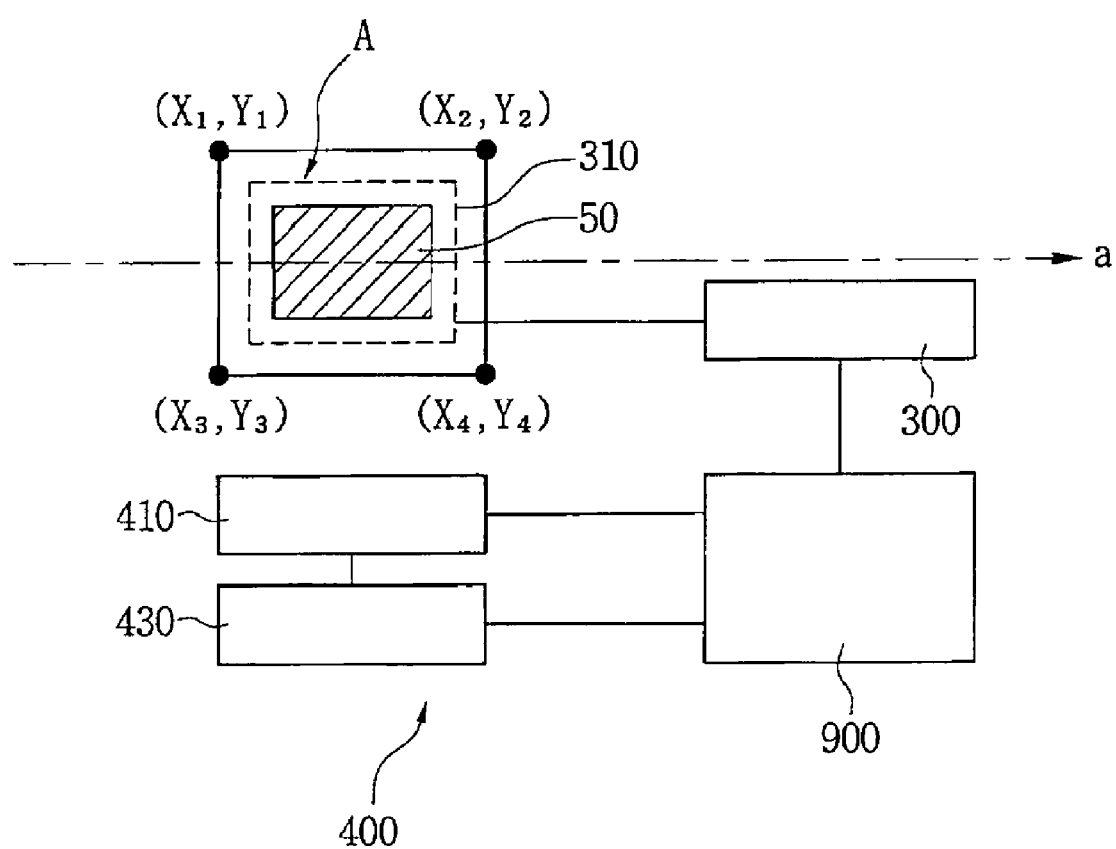
FIG. 2 is a view showing photographing of an electronic part disposed on a part recognition region of FIG. 1.

In addition, as shown in FIGS. 1 and 2, the part recognition region A may be located on the part moving path a, and may have a certain area. The region area of the part recognition region A may have position information constituted by four coordinates. Here, the part recognition region A may be an inner region of lines for connecting the position information (X1, Y1), (X2, Y2), (X3, Y3) and (X4, Y4).

Of course, the part recognition region A may be formed of single position information.

The constitution of the image processing unit 400 will be described in detail below with reference to FIGS. 3 to 6.

Figure 3:
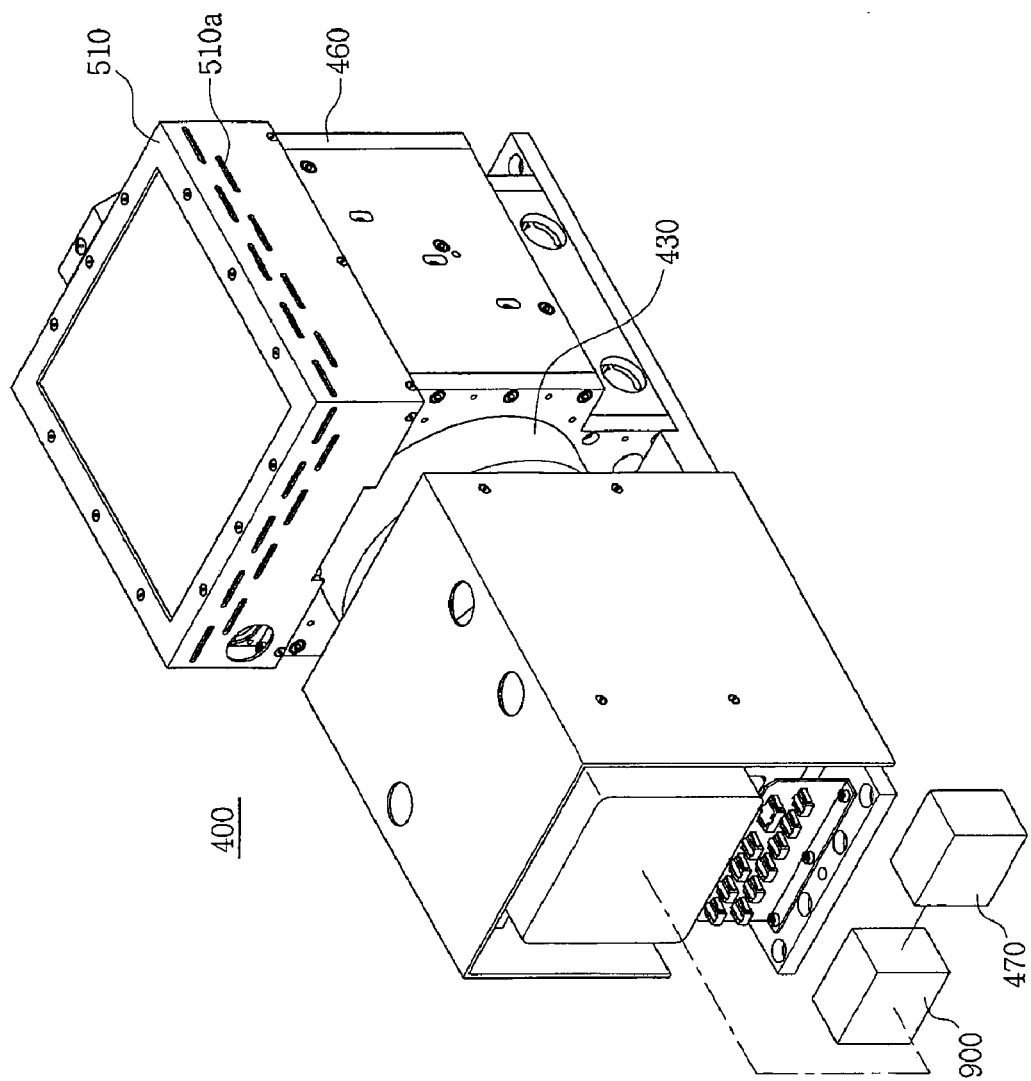
FIG. 3 is a perspective view of the electronic part recognition apparatus of FIG. 1.
Figure 4:
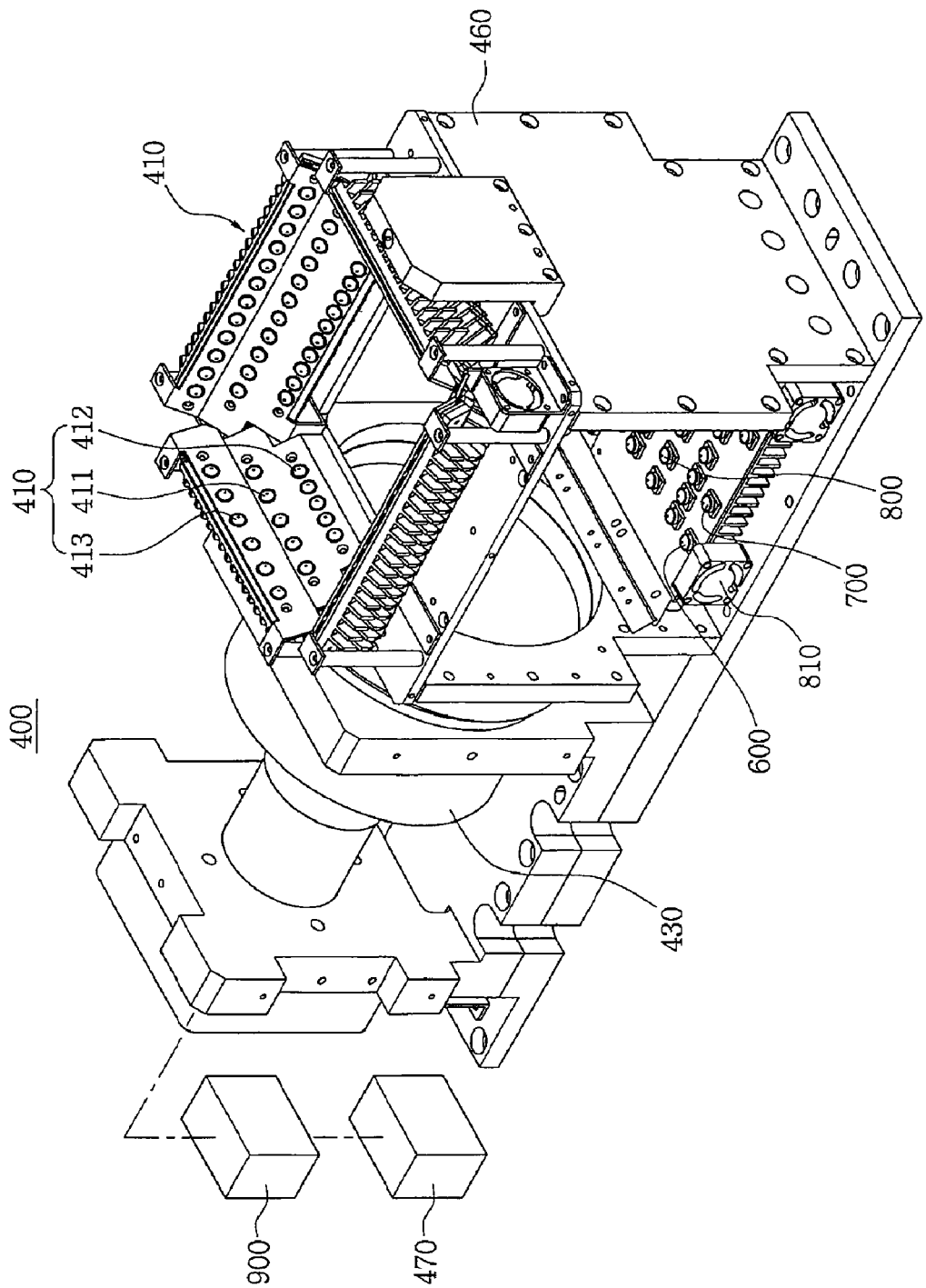
FIG. 4 is a perspective view showing the interior of the electronic part recognition apparatus of FIG. 3.

Referring to FIGS. 3 and 4, the image processing unit 400 includes a light source 410 and an image photographer 430.

The light source 410 may be installed in the main body 100 (see FIG. 1) to be located under the part recognition region A (see FIGS. 1 and 2), and may emit light having a certain illuminance or more onto the part recognition region A. Preferably, the illuminance may be 400,000 Lux or more. In addition, the emitted light may be flash illumination.

The light source 410 is installed at an illumination unit 460. The illumination unit 460 has a frame shape for defining a certain space. Here, the light source 410 is disposed at four inner surfaces of an upper end of the illumination unit 460. That is, the light source 410 has four channels as shown in FIG. 5.

Figure 5:
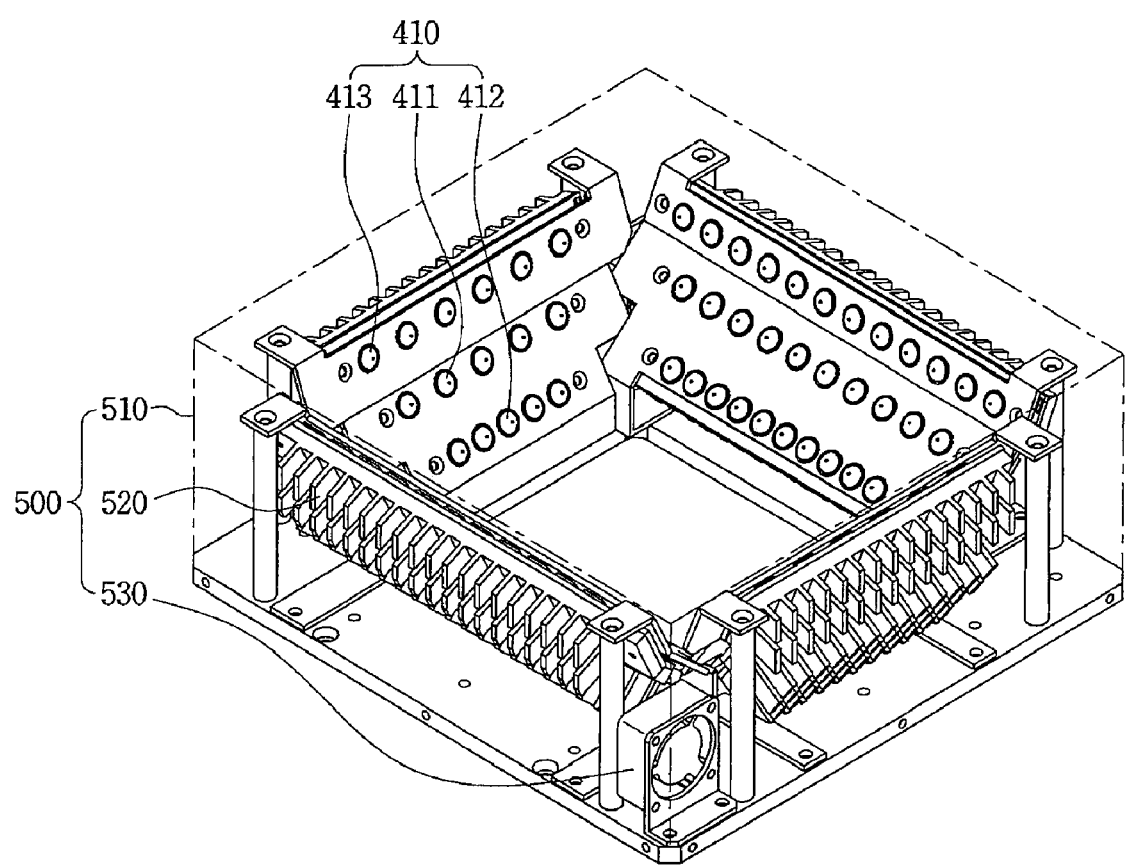
FIG. 5 is a perspective view of a light source of FIG. 4.

Referring to FIG. 5, the light source 410 corresponding to each channel includes a side illumination portion 413, and first and second inclination illumination portions 411 and 412 disposed under the side illumination portion 413. Here, the side illumination portion 413 and the first and second illumination portions 411 and 412 are constituted by a plurality of light emitting diodes. The light emitting diodes may be arranged such that the number of the light emitting diodes is gradually reduced from the side illumination portions 413 to the second inclination illumination portion 412.

Here, the side illumination portion 413 may support illumination provided at a lead and a ball of the electronic part 50 positioned at the part recognition region A (see FIG. 2). In addition, the first and second inclination illumination portions 411 and 412 may support illumination provided at side surfaces of a center portion of the electronic part 50.

Figure 6:
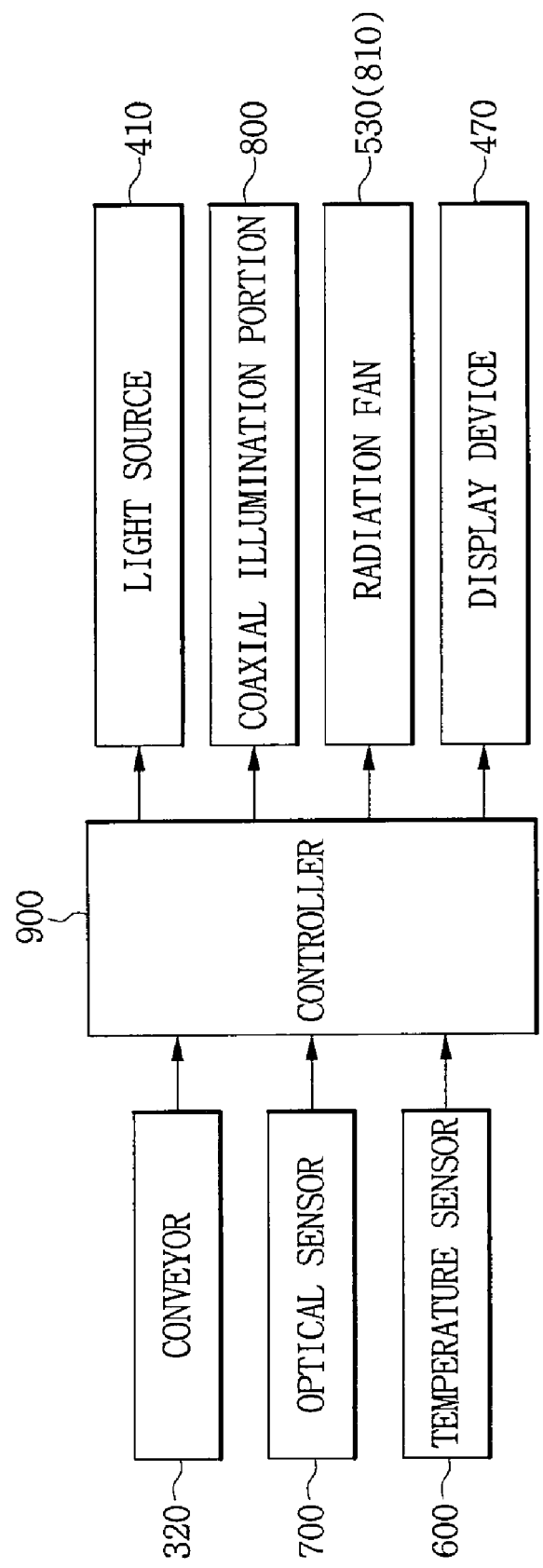
FIG. 6 is a block diagram showing operation of an image processing unit in accordance with an exemplary embodiment of the present invention.

In addition, referring to FIGS. 5 and 6, the illumination unit 460 may further include a radiation portion 500 for radiating heat generated by the light source 410.

Here, the radiation portion 500 may include a radiation cover 510 disposed in front of the light source 410, a radiation plate 520 disposed behind the light source 410, and a radiation fan 530 installed adjacent to the radiation plate 520 and electrically connected to the controller 900.

Meanwhile, the controller 900 may be electrically connected to the light source 410, receive a nozzle module moving signal (formed of position information), and turn on the light source 410 for a certain time.

That is, the part recognition region A may be set in the controller 900. In addition, the part recognition region A may be set by several coordinates having a plurality of position information to form a certain area, or single coordinates as position information.

Therefore, the controller 900 can transmit the photographing signal to the light source 410 when the moving signal is included in the set part recognition region A.

In addition, the controller 900 may set a light exposure time of the electronic part as 50 to 60 μs.

Figure 7:
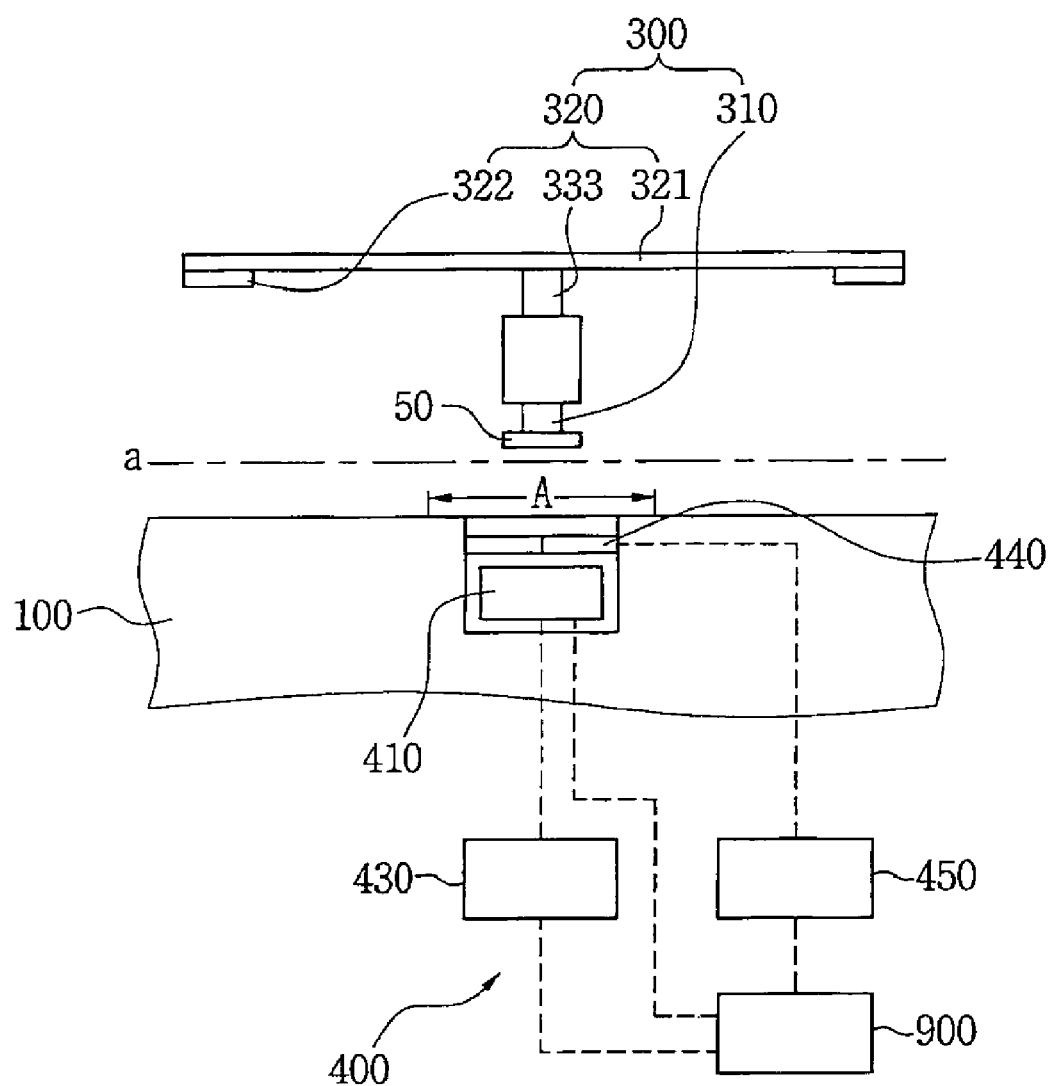
FIG. 7 is a view showing an image processing unit in accordance with another exemplary embodiment of the present invention.

Referring to FIGS. 7 and 8, the image processing unit 400 may include a shutter 440 and a shutter driver 450.

In this case, the shutter 440 is disposed adjacent to the light source 410 and can selectively transmit light emitted from the light source 410 to the exterior. The shutter 440 may be connected to an apparatus such as an iris.

The shutter driver 450 can open and close the shutter 440 to selectively expose the part recognition region A to the light emitted from the light source.

The controller 900 is electrically connected to the light source 410 and the shutter driver 450. Here, the controller 900 can turn on the light source 410, receive a moving signal from the position recognition portion, and open and close the shutter 440 using the shutter driver 450 for a certain time.

As shown in FIGS. 7 and 8, the image photographer 430 may be electrically connected to the controller 900, photograph an image of the electronic part 50 exposed to the light, and transmit the photographed image to the controller 900.

Meanwhile, referring to FIG. 4, the image photographer 430 may be a scan camera which is connected to the illumination unit 460. Here, the illumination unit 460 may further include a coaxial illumination portion 800. The coaxial illumination portion 800 includes light emitting diodes used as coaxial illumination. Here, a mirror (not shown) may be installed in an inner space of the illumination unit 460, in which the coaxial illumination portion 800 is disposed, to reflect the image of the electronic part 50 exposed to the light and guide the reflected image to the image photographer 430. In addition, a radiation fan 810 is further installed at the illumination unit 460 in which the coaxial illumination portion 800 is disposed.

Meanwhile, the illumination unit 460 further includes optical sensors 700 installed in an inner space thereof. The optical sensors 700 can measure intensity of light emitted from the light source 410 and transmit the measured light intensity to the controller 900. Here, the controller 900 can control operation of the light source such that the measured light intensity falls within a predetermined reference light intensity range.

In addition, the radiation portion 500 is disposed adjacent to the light source 410. The radiation portion 500 includes temperature sensors 600 for measuring a temperature around the light source 410 and transmitting the measured temperature to the controller 900. Here, the controller 900 can control operation of the radiation fans 530 and 810 such that the measured temperature is included in a predetermined reference temperature range.

Further, the image photographer 430, in accordance with an exemplary embodiment of the present invention, may further include a display device 470 electrically connected to the controller 900. Here, the display device 470 can display the image of the electronic part 50 photographed at the part recognition region A from the controller 900 as visual information. Furthermore, the controller 900 may have a reference image set to inspect misalignment of the electronic part 50 suctioned by the nozzle module 410. Therefore, the controller 900 can determine whether the image of the electronic part 50 is equal to a reference image, and then, display the image through the display device 470 to the exterior.

In addition, the display device 470 can display a temperature measured by the temperature sensor 600 and light intensity measured by the optical sensors 700.

Further, the display device 470 can display a camera exposure time and illuminance set by the controller 900.

Furthermore, the controller 900 may further include an input device (not shown) for selectively inputting the reference temperature range, the reference light intensity range, the camera exposure time, and the illuminance.

Operation of the electronic part recognition apparatus and the chip mounter having the same in accordance with an exemplary embodiment of the present invention will be described below.

Referring to FIGS. 1 and 2, the part supply unit 200 sequentially supplies a plurality of electronic parts 50 to the pick-up position P1.

Then, the conveyor 300 moves the nozzle module 310 to the pick-up position P1. A Z-axis conveyance portion 330 of the conveyor 300 lowers the nozzle module 310 to grip the electronic part 50. The conveyor 300 moves the nozzle module 310 along the part moving path a to the mounting position P2 where the printed circuit board P is located. Therefore, the electronic part 50 suctioned by the nozzle module 310 is conveyed along the part moving path a.

At this time, the position recognition portions (not shown) attached to the X-axis motor 321a and the Y-axis motor 322a of the conveyor 300 recognize moving signals (constituted by position information) of the nozzle module 310.

The position recognition portion transmits a moving signal as an electrical signal generated upon conveyance of the nozzle module 310 to the controller 900 of the image processing unit 400. Therefore, the controller 900 can recognize moving position information (coordinates) of the conveyed nozzle module 310 in real time.

In addition, the controller 900 can generate a photographing signal to the light source 410 of the image processing unit 400, when the real time position information is located at the part recognition region A formed of a plurality of coordinates. Here, the photographing signal is an operation signal of the light source 410. Therefore, the light source 410 can be instantly operated. Here, the controller 900 sets an operation time of the light source 410 to 50 to 60 µs, and illuminance of flash illumination emitted from the light source 410 to 400, 000 Lux.

Therefore, the controller 900 controls such that light emitted from the light source 410 is radiated onto the part recognition region A for 50 to 60 µs only.

As a result, while the nozzle module 310 suctions the electronic part and conveys it along the part moving path a, when the nozzle module 310 passes through the part recognition region A without stoppage, it is possible to expose the electronic part 50 suctioned by the nozzle module 310 to the light emitted from the light source 410 for 50 to 60 µs to photograph an image of the electronic part 50.

Here, the 50 to 60 µs may be conventional camera exposure time. Preferably, the image photographer 430 can photograph the image of the electronic part 50 suctioned by the nozzle module during movement of the electronic part 50 for 10 to 40 µs and transmit it to the controller 900.

The light emitted from the light source 410 may be constituted by the following four channels.

A bright field illumination system is used for illumination by light, and a dark field illumination system is used for recognition of a mirror-surface part such as a glittering part. In order to recognize a lead surface of the electronic part 50 or obtain sufficient image brightness for a short exposure time upon recognition of the electronic part such as a ball or a chip, a high-brightness illumination system is needed. At this time, the bright field illumination system is used to directly emit a sufficient amount of light.

In addition, since the image photographer 430 such as a scan camera electrically connected to the controller 900 is in an ON state, when the electronic part 50 is exposed to light, the image of the electronic part 50 can be photographed by the image photographer 430.

Then, the image photographer 430 transmits the image of the photographed electronic part to the controller 900 as an electrical signal.

As described above, when the controller 900 controls the light source 410 to be operated for an exposure time only, since the light is instantly emitted for 50 to 60 µs only, a temperature in the illumination unit 460 may not increase beyond a certain temperature and the illumination unit 460 may not continuously generate heat for a certain time or more. Therefore, the illumination unit 460 having the light source 410 may not include a separate radiation structure.

The light exposure time for photographing an image of the electronic part 50 may be set by the shutter 440 and the shutter driver 450.

In this case, when the nozzle module 310 to which the electronic part 50 is suctioned is located at the part recognition region A provided on the part moving path a by the conveyor 300, the controller 900 can open the shutter 440 using the shutter driver 450 for 50 to 60 µs. At this time, the light source 410 may be in a light-emitting state, and the image photographer 430 may also be in an operating state.

Therefore, the light emitted from the light source 410 can illuminate the electronic part 50 located at the part recognition region A during an opening time of the shutter 440, and an image of the illuminated electronic part 50 can be photographed by the image photographer 430. Then, the image photographer 430 can transmit the photographed image to the controller 900.

In this case, the illumination unit 460 having the light source 410 installed therein may heat up to a certain temperature or more.

At this time, the temperature sensor 600 installed at the illumination unit 460 can measure the temperature in the illumination unit 460 and transmit the measured temperature to the controller 900. Here, the controller 900 sets a reference temperature range.

In addition, the controller 900 can operate the radiation fans 530 and 810 such that the measure temperature falls within the reference temperature range. Therefore, the illumination unit 460 may be cooled to maintain a certain temperature by operation of the radiation fans 530 and 810.

Further, referring to FIG. 3, the radiation cover 510 has a plurality of radiation slits 510*a*. Therefore, the illumination unit 460 may be readily cooled by the radiation slits 510*a*, the radiation cover 510 and the radiation plate 520.

When the electronic part 50 located at the part recognition region A is exposed to the light emitted from the light source 410 for 50 to 60 µs, it is possible to uniformly maintain the light intensity.

That is, the optical sensor 700 is installed in the illumination unit 460. The optical sensor 700 measures the intensity of light emitted from the light source 410 and transmits it to the controller 900. Here, the controller 900 sets a reference light intensity range.

In addition, the controller 900 can operate the light source 410 such that the measured light intensity falls within the reference light intensity range.

As can be seen from the foregoing, an electronic part recognition apparatus in accordance with an exemplary embodiment of the present invention can capture an image of an electronic part suctioned by a nozzle installed in a head of a chip mounter and moved without stoppage of the head to recognize a state of the suctioned electronic part, thereby readily controlling the chip mounter and reducing a process time.

In addition, it is possible to recognize the electronic part using multi-array light sources at various angles while the part is suctioned by a nozzle and moved.

Further, it is possible to turn on multi-array light sources optimized to recognize the electronic part and to recognize mirror-surface parts by differentiating positions and light intensities of the light sources arrayed depending on characteristics of the part in an illumination system using the multi-array light sources.

Furthermore, it is possible to shorten a light exposure time of the electronic part to 50~60 µs while the part is suctioned by a nozzle and moved, and perform instant channel-specific lighting in order to provide sufficient light intensity for the short exposure time.

The system or systems may be implemented on any form of computer or computers and the components may be implemented as dedicated applications or in client-server architectures, including a web-based architecture, and can include functional programs, codes, and code segments. Any of the computers may comprise a processor, a memory for storing program data and executing it, a permanent storage such as a disk drive, a communications port for handling communications with external devices, and user interface devices, including a display, keyboard, mouse, etc. When software modules are involved, these software modules may be stored as program instructions or computer readable codes executable on the processor on a computer-readable media such as read-only memory (ROM), random-access memory (RAM), CD-ROMs, magnetic tapes, floppy disks, optical data storage devices, and carrier waves (such as data transmission through the Internet). The computer readable recording medium can also be distributed over network coupled computer systems so that the computer readable code is stored and executed in a distributed fashion. This media can be read by the computer, stored in the memory, and executed by the processor.

For the purposes of promoting an understanding of the principles of the invention, reference has been made to the preferred embodiments illustrated in the drawings, and specific language has been used to describe these embodiments. However, no limitation of the scope of the invention is intended by this specific language, and the invention should be construed to encompass all embodiments that would normally occur to one of ordinary skill in the art.

The present invention may be described in terms of functional block components and various processing steps. Such functional blocks may be realized by any number of hardware and/or software components configured to perform the specified functions. For example, the present invention may employ various integrated circuit components, e.g., memory elements, processing elements, logic elements, look-up tables, and the like, which may carry out a variety of functions under the control of one or more microprocessors or other control devices. Similarly, where the elements of the present invention are implemented using software programming or software elements the invention may be implemented with any programming or scripting language such as C, C++, Java, assembler, or the like, with the various algorithms being implemented with any combination of data structures, objects, processes, routines or other programming elements. Furthermore, the present invention could employ any number of conventional techniques for electronics configuration, signal processing and/or control, data processing and the like. The words "mechanism" and "element" are used broadly and are not limited to mechanical or physical embodiments, but can include software routines in conjunction with processors, etc.

The particular implementations shown and described herein are illustrative examples of the invention and are not intended to otherwise limit the scope of the invention in any way. For the sake of brevity, conventional electronics, control systems, software development and other functional aspects of the systems (and components of the individual operating components of the systems) may not be described in detail. Furthermore, the connecting lines, or connectors shown in the various figures presented are intended to represent exemplary functional relationships and/or physical or logical couplings between the various elements. It should be noted that many alternative or additional functional relationships, physical connections or logical connections may be present in a practical device. Moreover, no item or component is essential to the practice of the invention unless the element is specifically described as "essential" or "critical".

The use of the terms "a" and "an" and "the" and similar referents in the context of describing the invention (especially in the context of the following claims) are to be construed to cover both the singular and the plural. Furthermore, recitation of ranges of values herein are merely intended to serve as a shorthand method of referring individually to each separate value falling within the range, unless otherwise indicated herein, and each separate value is incorporated into the specification as if it were individually recited herein. Finally, the steps of all methods described herein can be performed in any suitable order unless otherwise indicated herein or otherwise clearly contradicted by context. Numerous modifications and adaptations will be readily apparent to those skilled in this art without departing from the spirit and scope of the present invention.

What is claimed is:

1. An electronic part recognition apparatus comprising:
   a part conveyor unit for moving an electronic part along a part moving path and mounting the part at a mounting position;
   a position recognition portion for continuously recognizing position information of the part conveyor unit moving along the part moving path;
   a controller for receiving the position information from the position recognition portion and generating a photographing signal; and
   an image processing unit for receiving the photographing signal from the controller and exposing the electronic part to light of a light source for a certain time to photograph an image of the electronic part using an image photographer when the electronic part is located at a part recognition region while the part conveyor unit moves,
   wherein:
   the light source is located under the electronic part at the part recognition region;
   the image processing unit comprises:
      the light source disposed adjacent to the part recognition portion that emits the light at a certain predefined luminance or more; and
      the image photographer electrically connected to the controller that photographs the image of the electronic part exposed to the light for the certain time, and transmits the photographed image to the controller;
   the controller generates the photographing signal to turn on the light source for a certain time; and
   the part recognition is set in the controller.

2. The apparatus according to claim 1, wherein:
   the part conveyor unit comprises:
      a nozzle module disposed on the part moving path that grips the electronic part by suction provided from the exterior; and
      a conveyor connected to the nozzle module that continuously moves the nozzle module along the part moving path, and transmits the position information within the part recognition region to the controller; and
   the position recognition portion is an encoder installed at the conveyor and transmits moving position information of the conveyor to the controller as an electrical signal.

3. The apparatus according to claim 1, wherein the controller controls operation of the light source such that a light exposure time is in the range of 50~60 μs.

4. The apparatus according to claim 1, wherein:
   the image processing unit comprises:
      a shutter for opening and closing light emitted from the light source; and
      a shutter driver for receiving a photographing signal from the controller and opening and closing the shutter; and
   the controller operates the shutter driver such that a light exposure time is in the range of 50~60 μs.

5. The apparatus according to claim 1, wherein:
   the controller is electrically connected to optical sensors for measuring intensity of light emitted from the light source and transmitting the measured light intensity to the controller; and
   the controller controls operation of the light source such that the measured light intensity falls within a predetermined reference light intensity range.

6. The apparatus according to claim 1, wherein the light source comprises:
   a side illumination portion installed to help illumination provided at a lead and a ball of the electronic part; and
   first and second illumination portions installed to help illumination provided at a center portion of the electronic part.

7. The apparatus according to claim 1, wherein:
   the light source is installed at an illumination unit to provide flash illumination; and
   the illumination unit further comprises a radiation portion for radiating heat generated by the light source.

8. The apparatus according to claim 7, wherein the radiation portion comprises:
   a radiation cover disposed in front of the light source;
   a radiation plate disposed behind the light source; and
   a radiation fan installed adjacent to the radiation plate and electrically connected to the controller.

9. The apparatus according to claim 8, wherein:
   the radiation portion further comprises:
      a temperature sensor disposed adjacent to the light source that measures a temperature adjacent to the light source, and transmits the measured temperature to the controller; and
   the controller controls operation of the radiation portion such that the temperature falls within the reference temperature range.

10. A chip mounter comprising:
    a main body having a mounting position of the electronic part and a part moving path along which the electronic part moves to the mounting position;
    a part supply unit installed at the main body that supplies the moving electronic part;
    a part conveyor unit installed at the main body that receives the electronic part from the part supply unit to move the electronic part along the part moving path to the mounting position and mount the electronic part;
    a position recognition portion for continuously recognizing position information of the part conveyor unit moving along the part moving path;
    a controller for receiving the position information from the position recognition portion and generating a photographing signal; and
    an image processing unit for receiving the photographing signal from the controller and exposing the electronic part to light of a light source for a certain time to photograph an image of the electronic part using an image photographer when the electronic part is located at a part recognition region while the part conveyor unit moves,
    wherein:
    the light source is illuminated upwardly to the electronic part at the part recognition region, and the electronic part forms angle more than 0° with respect to the image photographer at the part recognition region;
    the image processing unit comprises:
       the light source disposed adjacent to the part recognition portion that emits the light at a certain illuminance or more; and the image photographer electrically connected to the controller that photographs the image of the electronic part exposed to the light for the certain time, and transmits the photographed image to the controller; and the controller generates the photographing signal to turn on the light source for a certain time, and the part recognition region is set in the controller.

11. The chip mounter according to claim 10, wherein:

the part conveyor unit comprises:

a nozzle module disposed on the part moving path that grips the electronic part by suction provided from the exterior; and a conveyor connected to the nozzle module that continuously moves the nozzle module along the part moving path, and transmits the position information within the part recognition region to the controller; and the position recognition portion is an encoder installed at the conveyor that transmits moving position information of the conveyor to the controller as an electrical signal.

12. The chip mounter according to claim 10, wherein the controller controls operation of the light source such that a light exposure time is in the range of 50~60 μs.

13. The chip mounter according to claim 10, wherein:

the image processing unit comprises:

a shutter for opening and closing light emitted from the light source; and a shutter driver for receiving a photographing signal from the controller and opening and closing the shutter; and the controller operates the shutter driver such that a light exposure time is in the range of 50~60 μs.

14. The chip mounter according to claim 10, wherein:

the controller is electrically connected to optical sensors for measuring intensity of light emitted from the light source and transmits the measured light intensity to the controller; and the controller controls operation of the light source such that the measured light intensity falls within a predetermined reference light intensity range.

15. The chip mounter according to claim 10, wherein the light source comprises:

a side illumination portion installed to help illumination provided at a lead and a ball of the electronic part; and first and second illumination portions installed to help illumination provided at a center portion of the electronic part.

16. The chip mounter according to claim 10, wherein:

the light source is installed at an illumination unit to provide flash illumination; and the illumination unit further comprises a radiation portion for radiating heat generated by the light source.

17. The chip mounter according to claim 16, wherein the radiation portion comprises:

a radiation cover disposed in front of the light source;

a radiation plate disposed behind the light source; and a radiation fan installed adjacent to the radiation plate and electrically connected to the controller.

18. The chip mounter according to claim 17, wherein:

the radiation portion further comprises a temperature sensor disposed adjacent to the light source that measures a temperature adjacent to the light source and transmits the measured temperature to the controller; and the controller controls operation of the radiation portion such that the temperature falls within the reference temperature range.

* * * * *